United States Patent
Lee

(10) Patent No.: US 7,202,158 B2
(45) Date of Patent: Apr. 10, 2007

(54) METHOD FOR FABRICATING A METAL-INSULATOR-METAL CAPACITOR

(75) Inventor: June Woo Lee, Osan-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,590

(22) Filed: Dec. 30, 2005

(65) Prior Publication Data
US 2006/0292715 A1 Dec. 28, 2006

(30) Foreign Application Priority Data
Jun. 27, 2005 (KR) ............... 10-2005-0055563

(51) Int. Cl.
*H01L 21/4763* (2006.01)
(52) U.S. Cl. .............. 438/622; 438/637; 257/621; 257/E23.145; 257/E23.627; 257/E21.641
(58) Field of Classification Search ........ 438/622–624, 438/636, 637; 257/621, 774
See application file for complete search history.

(56) References Cited

U.S. PATENT DOCUMENTS 6,898,851 B2 * 5/2005 Nishioka et al. .............. 29/852

* cited by examiner

*Primary Examiner*—Quoc Hoang
(74) *Attorney, Agent, or Firm*—Lowe Hauptman & Berner, LLP

(57) ABSTRACT

A method fabricating multiple wiring metals in a semiconductor device. The method includes forming a lower wiring metal on a semiconductor substrate, forming an interlayer dielectric on the lower wiring metal, and selectively removing the interlayer dielectric to form a contact dielectric film, a body dielectric film and an opening between the contact and body dielectric films. The method also includes filling the opening with low-k material, forming a capping dielectric on the contact and body dielectric films and the low-k material, forming a contact hole passing through the capping dielectric and the contact dielectric film to be connected to the lower wiring metal, and forming an upper wiring metal electrically interconnected to the lower wiring metal through the contact hole.

4 Claims, 5 Drawing Sheets

METHOD FOR FABRICATING A METAL-INSULATOR-METAL CAPACITOR

CROSS-REFERENCE TO RELATED APPLICATION

This application claims priority to and the benefit of Korean Patent Application No. 10-2005-0055563 filed in the Korean Intellectual Property Office on Jun. 27, 2005, the entire contents of which are incorporated herein by reference.

BACKGROUND OF THE INVENTION

1. Field of the Invention

The present invention relates to multiple wiring technologies, and more specifically, to a multiple wiring metal structure employing low-k dielectric material and a method for fabricating such a structure in a semiconductor device.

2. Discussion of the Related Art

Logic IC devices are progressing to achieve higher operational speed and higher integration with a miniaturization of components such as transistors. Such highly integrated transistors require smaller wiring for interconnecting circuit elements and for paths for power supply and signal transmission. Among other limitations, signal delay in the fine metal wires becomes significant in decreasing the operational speed.

Copper having low electric resistance (e.g., 62% than aluminum metal) is used as a material for wiring metal, and material having lower dielectric constant (low-k) is used for insulating or dielectric material between multiple copper metal layers. With these materials, parasitic capacitance between the upper and lower wiring metals is decreased to enable a higher operational speed and to reduce crosstalk between circuit elements. For minimizing the signal delay, it is not sufficient to employ only conductive material having lower resistance, and thus it has to be combined with the interlayer dielectric material of low-k.

Very low-k (VLK) dielectric material having less than "3.0" of dielectric constant may be a candidate for the next generation interlayer dielectric material. This is because the conventional low-k material such as undoped silicate glass (USG) and fluoro-silicate glass (FSG) reveals limits in applying to existing fabrication capability due to signal cross talk as the width and thickness of the interlayer dielectric decreases.

For overcoming the limits, various low-k dielectrics such as carbonate silicate glass (CSG), alpha-fluorinated amorphous carbon (α-FC), and hydrogen silsesquioxane (HSQ) have been developed. However, they reveal problems of, e.g., inferior stability and outgassing in subsequent thermal processes.

SUMMARY OF THE INVENTION

It is an object of the present invention to overcome the limits of conventional low-k materials.

In a first aspect, embodiments of the present invention are directed to a method fabricating multiple wiring metals in a semiconductor device, comprising the steps of: forming a lower wiring metal on a semiconductor substrate; forming an interlayer dielectric on the lower wiring metal; selectively removing the interlayer dielectric to form a contact dielectric film, a body dielectric film and an opening between the contact and body dielectric films; filling the opening with low-k material; forming a capping-dielectric on the contact and body dielectric films and the low-k material; forming a contact hole passing through the capping dielectric and the contact dielectric film to be connected to the lower wiring metal; and forming an upper wiring metal electrically interconnected to the lower wiring metal through the contact hole.

In a second aspect, embodiments of the present invention are directed to a multiple wiring metal structure comprising: a lower wiring metal formed on a semiconductor substrate; a contact dielectric film and a body dielectric film formed on the lower wiring metal; a low-k dielectric filling opening between the contact and body dielectric films; a capping dielectric formed on the contact and body dielectric films and the capping dielectric; and an upper wiring metal electrically interconnected to the lower wiring metal through a contact hole formed by passing through the capping dielectric and the contact dielectric film.

The low-k dielectric includes carbonate silicate glass (CSG), alpha-fluorinated amorphous carbon (α-FC), and hydrogen silsesquioxane (HSQ).

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

FIGS. 1 to 8 are cross-sectional views for illustrating the processing steps for fabricating multiple wiring metals in a semiconductor device according to the present invention.

Figure 1:
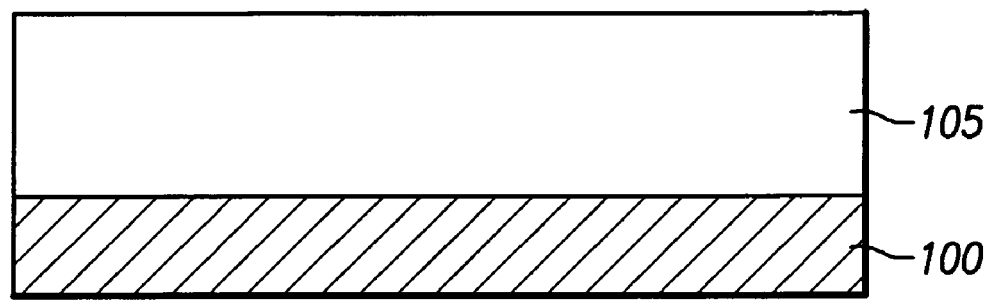
FIGS. 1 to 8 are cross-sectional views illustrating a method for manufacturing multiple wiring metals in semiconductor IC devices according to the present invention.

Referring to FIG. 1, an interlayer dielectric 105 is deposited on a lower wiring metal 100 that can be formed on a semiconductor substrate.

Figure 2:
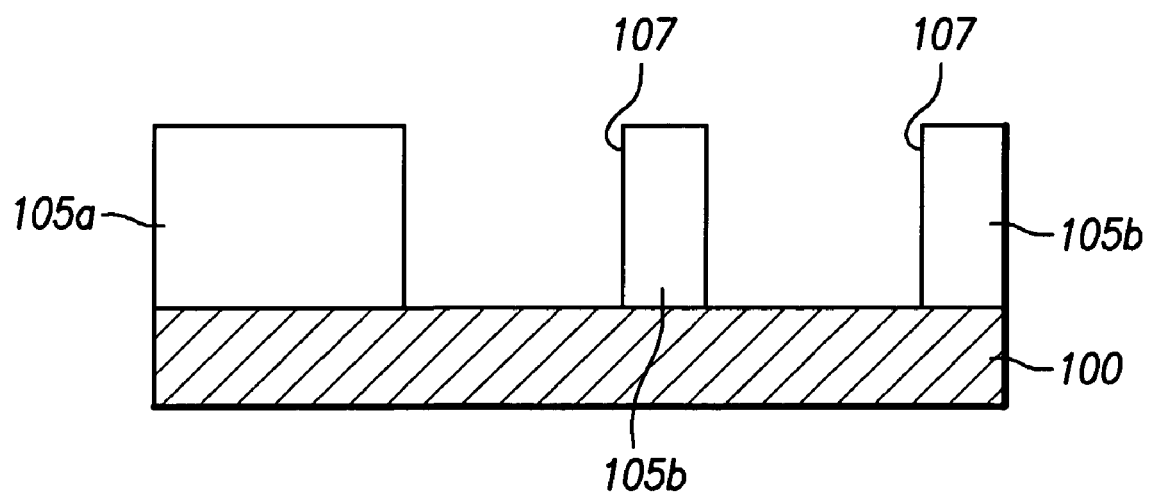

Referring FIG. 2, the interlayer dielectric 105 is selectively etched by a conventional photolithographic process until the lower wiring metal 100 is exposed. The selective etching of the interlayer dielectric 105 forms contact dielectric films 105a and body dielectric films 105b. Thus, openings 107 are formed between neighboring contact dielectric films 105a and body dielectric films 105b. The openings 107 are filled with low-k dielectric material as explained below. Though not shown in FIG. 2, a part of the interlayer dielectric material can remain on the surface of lower wiring metal 100 at the openings 107.

Figure 3:
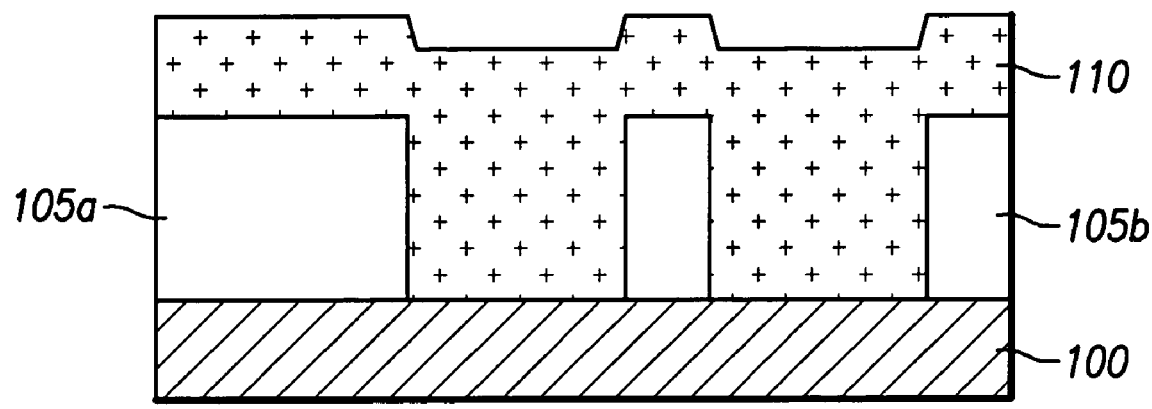

Referring to FIG. 3, low-k material 110 is deposited to fill the openings 107 between the contact dielectric films 105a and body dielectric films 105b. The low-k material 110 includes carbonate silicate glass (CSG), alpha-fluorinated amorphous carbon (α-FC), and hydrogen silsesquioxane (HSQ), and can be deposited by a silicon on glass (SOG) or a chemical vapor deposition (CVD) technique.

Figure 4:
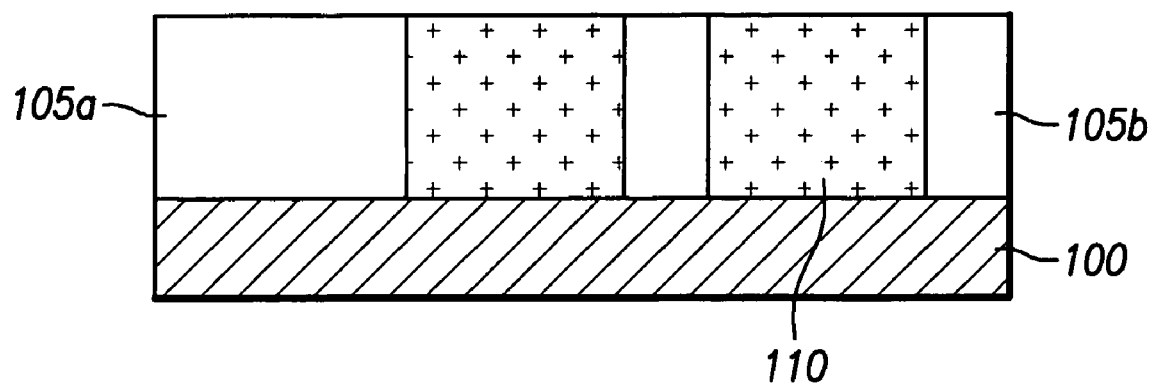

Referring to FIG. 4, the surface of the deposited low-k material 110 is polished or planarized until the contact dielectric film 105a and body dielectric film 105b are exposed. The planarization can be performed by a chemical mechanical polishing (CMP) or an etch-back technique. With this processing step, the low-k material 110 fills the opening 107.

Figure 5:
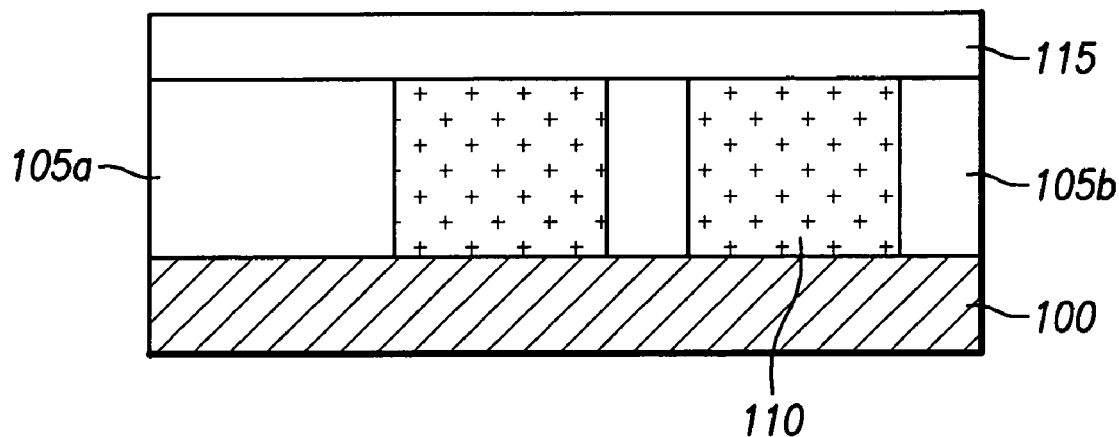

Referring to FIG. 5, capping dielectric 115 is formed on the entire surface of the planarized substrate. The capping dielectric 115, formed by, e.g., silicon-rich oxide, prevents pattern peeling of the underlying low-k dielectric 110 due to outgas in subsequent processing steps.

Figure 6:
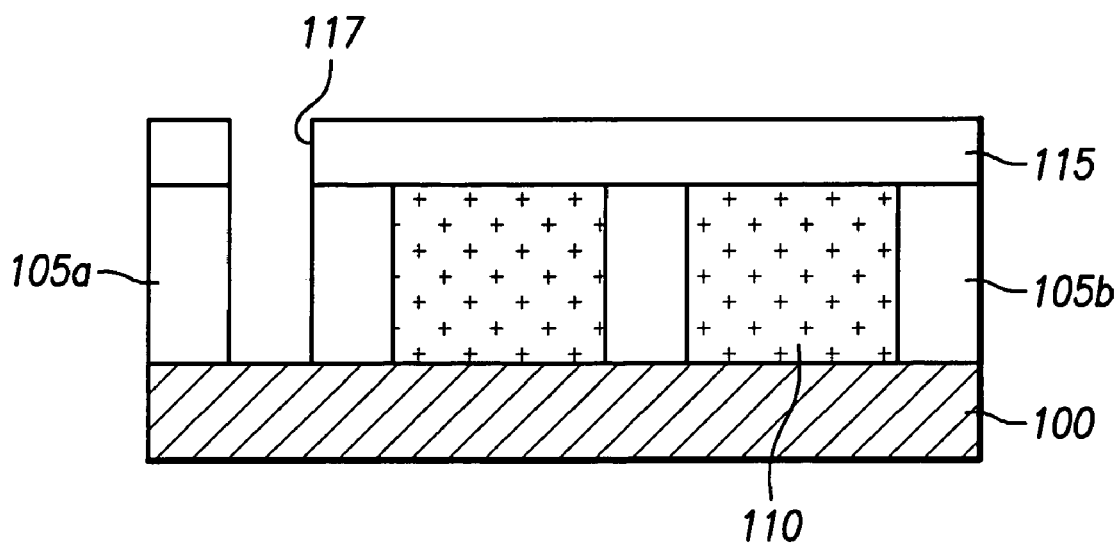

Referring to FIG. 6, the capping dielectric 115 and contact dielectric film 105*a* are selectively removed, until the lower wiring metal 100 exposes, by photolithographic technique to form a contact hole 117 which passes through the contact dielectric film 105*a* and capping dielectric 115.

Figure 7:
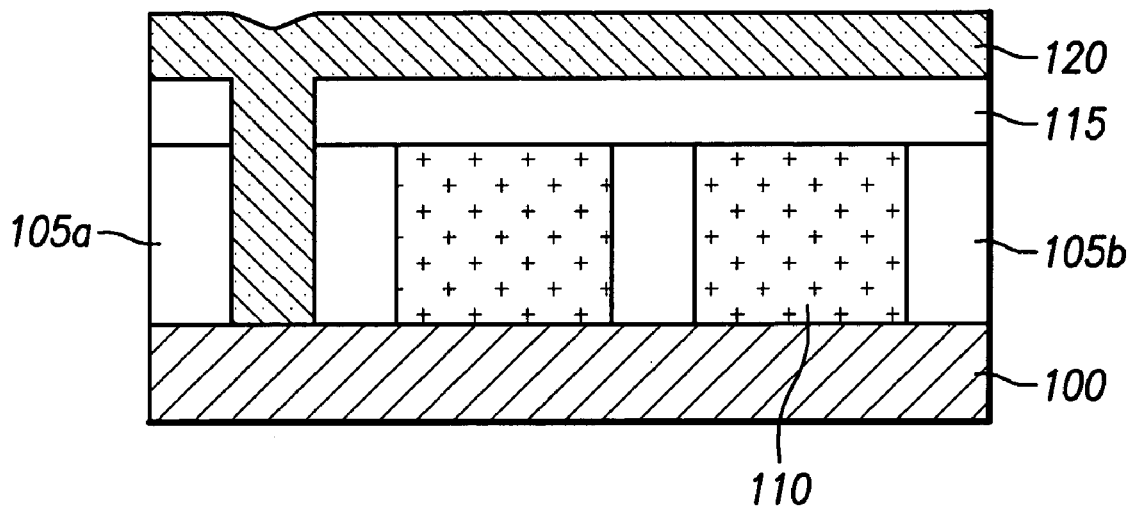

Referring to FIG. 7, electrically conductive material 120 is deposited on to fill the contact hole 117. The conductive material 120 can be formed by CVD of tungsten.

Figure 8:
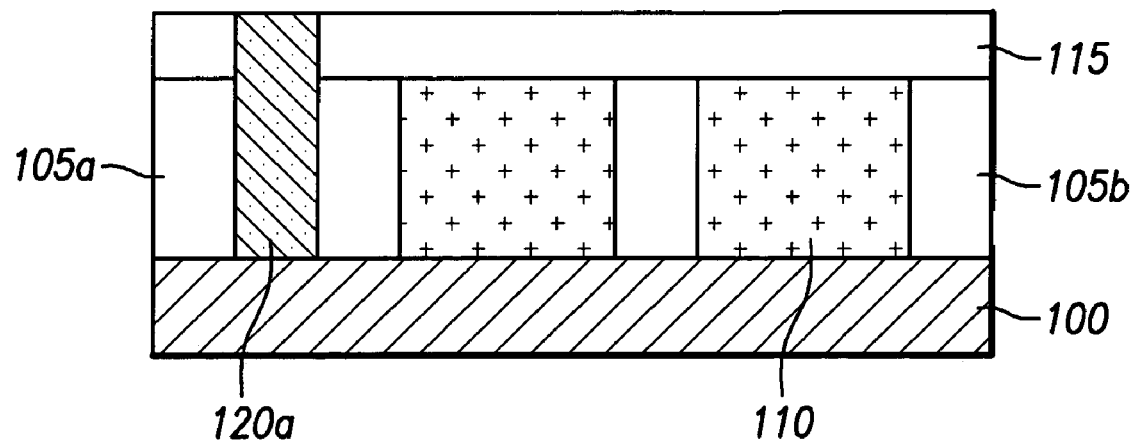

Referring to FIG. 8, the surface of conductive material 120 is planarized until the top surface of capping dielectric 115 is exposed to form contact plug 120*a* filling the contact hole 117. The contact plug 120*a*, having sidewalls surrounded by the contact dielectric 105*a*, can prevent outgas of the low-k material 110, and compensate for mechanical defects in the low-k dielectric material 110. Further, the body dielectric film 105*b*, disposed in constant intervals in the low-k dielectric material 110, can prevent outgas and compensate mechanical defects of the low-k material.

Figure 9:
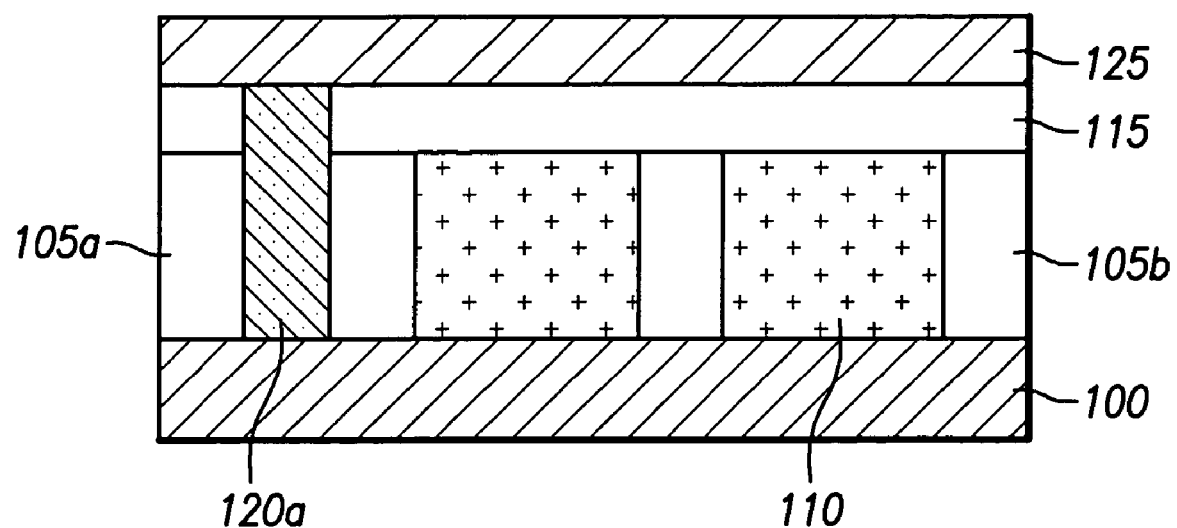
FIG. 9 is a cross sectional view of multiple wiring metals of the present invention.

FIG. 9 is a cross-sectional view for illustrating the multiple wiring metal structure according to the present invention.

Referring to FIG. 9, the multiple wiring metal structure comprises lower wiring metal 100 formed on a semiconductor substrate (not shown) and contact dielectric film 105*a* and body dielectric film 105*b* formed on the lower wiring metal 100. Between the contact and body dielectric films 105*a* and 105*b* is filled with low-k dielectric 110*a*. On the contact and body dielectric films 105*a* and 105*b* and the low-k dielectric 110*a* is formed a capping dielectric 115. Conductive contact plug 120*a* passes through the capping dielectric 115 and contact dielectric film 105*a* and electrically interconnected to both the lower wiring metal 100 and upper wiring metal 125.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating multiple wiring metals in a semiconductor device, comprising the steps of:
   forming a lower wiring metal on a semiconductor substrate;
   forming an interlayer dielectric on the lower wiring metal;
   selectively removing the interlayer dielectric to form a contact dielectric film, a body dielectric film and an opening between the contact and body dielectric films;
   filling the opening with low-k material;
   forming a capping dielectric on the contact and body dielectric films and the low-k material;
   forming a contact hole passing through the capping dielectric and the contact dielectric film to be connected to the lower wiring metal; and
   forming an upper wiring metal electrically interconnected to the lower wiring metal through the contact hole.

2. The method of claim 1, wherein the opening exposes the lower wiring metal.

3. The method of claim 1, wherein a part of the interlayer dielectric remains at a bottom of the opening.

4. The method of claim 1, wherein the low-k dielectric is at least one of carbonate silicate glass (CSG), alpha-fluorinated amorphous carbon (α-FC), and hydrogen silsesquioxane (HSQ).

* * * * *